(12) United States Patent
Toyoguchi

(10) Patent No.: US 10,381,388 B2
(45) Date of Patent: Aug. 13, 2019

(54) SOLID-STATE IMAGING DEVICE AND IMAGING SYSTEM

(71) Applicant: CANON KABUSHIKI KAISHA, Tokyo (JP)

(72) Inventor: Ginjiro Toyoguchi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 31 days.

(21) Appl. No.: 15/877,868

(22) Filed: Jan. 23, 2018

(65) Prior Publication Data

US 2018/0219033 A1 Aug. 2, 2018

(30) Foreign Application Priority Data

Jan. 30, 2017 (JP) ................................ 2017-014552

(51) Int. Cl.
*H01L 27/146* (2006.01)
*G01C 3/08* (2006.01)
(Continued)

(52) U.S. Cl.
CPC .......... *H01L 27/1461* (2013.01); *G01C 3/085* (2013.01); *G01J 1/44* (2013.01);
(Continued)

(58) Field of Classification Search
CPC ....... B60W 2050/143; B60W 2420/42; B60W 2510/20; B60W 2520/10; B60W 2520/14; B60W 2710/0677; B60W 2710/18; B60W 30/09; B60W 50/14; G01C 3/085; G01J 1/44; G01J 2001/448; H01L 27/1461; H04N 5/3559
See application file for complete search history.

(56) References Cited

U.S. PATENT DOCUMENTS 8,921,900 B2 12/2014 Iida et al.
9,124,833 B2 9/2015 Toyoguchi et al.
(Continued)

FOREIGN PATENT DOCUMENTS

JP 2008-078302 A 4/2008
JP 2014-165286 A 9/2014

*Primary Examiner* — Peter D Le
(74) *Attorney, Agent, or Firm* — Venable LLP

(57) ABSTRACT

A solid-state imaging device includes a plurality of pixels each including a photoelectric converter that generates charges by photoelectric conversion and a charge holding portion that holds charges transferred from the photoelectric converter. The photoelectric converter includes a first semiconductor region of a first conductivity type provided in a surface portion of a semiconductor substrate, a second semiconductor region of a second conductivity type provided under the first semiconductor region and configured to accumulate generated charges, a third semiconductor region of the first conductivity type provided under the second semiconductor region, and a fourth semiconductor region of the first conductivity type provided in a part of a portion between the first and second semiconductor regions. In a plan view, the second semiconductor region has a first region not overlapping with the third semiconductor region, and the fourth semiconductor region overlaps with at least a part of the first region.

19 Claims, 10 Drawing Sheets

(51) Int. Cl.
 *G01J 1/44* (2006.01)
 *H04N 5/355* (2011.01)
 *B60W 30/09* (2012.01)
 *B60W 50/14* (2012.01)

(52) U.S. Cl.
 CPC ........... *H04N 5/3559* (2013.01); *B60W 30/09* (2013.01); *B60W 50/14* (2013.01); *B60W 2050/143* (2013.01); *B60W 2420/42* (2013.01); *B60W 2510/20* (2013.01); *B60W 2520/10* (2013.01); *B60W 2520/14* (2013.01); *B60W 2710/0677* (2013.01); *B60W 2710/18* (2013.01); *G01J 2001/448* (2013.01)

(56) References Cited

U.S. PATENT DOCUMENTS

| | | | |
|---|---|---|---|
| 9,548,328 B2 | 1/2017 | Hasegawa et al. | |
| 2005/0092894 A1* | 5/2005 | Fossum | H01L 27/14609 250/208.1 |
| 2006/0181626 A1* | 8/2006 | Lee | H01L 27/14643 348/308 |
| 2007/0257280 A1* | 11/2007 | Hynecek | H01L 27/14609 257/225 |
| 2008/0111170 A1* | 5/2008 | Kim | H01L 27/14609 257/292 |
| 2008/0266434 A1* | 10/2008 | Sugawa | H01L 27/14609 348/308 |
| 2009/0295973 A1* | 12/2009 | Oshikubo | H04N 5/3559 348/311 |
| 2011/0180860 A1* | 7/2011 | Yamada | H01L 27/1461 257/291 |
| 2013/0015513 A1* | 1/2013 | Kido | H01L 27/1461 257/292 |

\* cited by examiner

SOLID-STATE IMAGING DEVICE AND IMAGING SYSTEM

BACKGROUND OF THE INVENTION

Field of the Invention

The present invention relates to a solid-state imaging device and an imaging system.

Description of the Related Art

In solid-state imaging devices represented by a CCD image sensor or a CMOS image sensor, the sensitivity, the saturation charge amount, and the charge transfer performance of a photoelectric converter are important characteristics that decide the performance of a solid-state imaging device.

As a photoelectric converter of a CCD image sensor or a CMOS image sensor, a use of an embedded photodiode having a p-n junction of a p-type semiconductor region provided in a surface portion of a semiconductor substrate and an n-type semiconductor region forming a charge accumulation region is the mainstream. In this case, signal carriers generated in the photoelectric converter are electrons.

As the structure of a substrate in which photoelectric convertors are arranged, there are n-type substrate structure and p-well structure. The n-type substrate structure is a structure in which a p-type semiconductor region is provided in a deep portion of an n-type semiconductor substrate having a low impurity concentration and a photoelectric converter is arranged inside an n-type semiconductor region of the substrate surface electrically isolated from a semiconductor substrate located in a deeper portion. The p-well structure is a structure in which a photoelectric converter is arranged inside a p-well provided in the surface portion of a semiconductor substrate.

The n-type substrate structure is featured in that signal charges generated inside the n-type semiconductor region are easily collected by the drift force resulting in a high sensitivity. A solid-state imaging device having a photoelectric converter of the n-type substrate structure is disclosed in Japanese Patent Application Laid-Open No. 2008-078302, for example. On the other hand, the p-well structure is featured in that a p-n junction capacitor is formed between an n-type semiconductor region forming a charge accumulation region and a p-well resulting in a large saturation charge amount. A solid-state imaging device having a photoelectric converter of the p-type well structure is disclosed in Japanese Patent Application Laid-Open No. 2014-165286, for example. In the solid-state imaging device disclosed in Japanese Patent Application Laid-Open No. 2008-078302 and Japanese Patent Application Laid-Open No. 2014-165286, the p-type semiconductor region is arranged under the n-type semiconductor region forming a charge accumulation region to increase the p-n junction capacitance, and thereby the saturation charge amount of the photoelectric converter is increased.

However, the solid-state imaging devices disclosed in Japanese Patent Application Laid-Open No. 2008-078302 and Japanese Patent Application Laid-Open No. 2014-165286 are not always an appropriate configuration in ensuring a sufficient transfer performance while achieving both a high sensitivity and a large saturation charge amount.

SUMMARY OF THE INVENTION

An object of the present invention is to provide a solid-state imaging device that can improve a charge transfer performance while achieving both a high sensitivity and a large saturation charge amount of a photoelectric converter.

According to one aspect of the present invention, there is provided a solid-state imaging device including a plurality of pixels, each of the plurality of pixels including a photoelectric converter that generates charges by photoelectric conversion and a charge holding portion that holds charges transferred from the photoelectric converter, wherein the photoelectric converter includes a first semiconductor region of a first conductivity type provided in a surface portion of a semiconductor substrate, a second semiconductor region of a second conductivity type provided under the first semiconductor region and configured to accumulate generated charges, a third semiconductor region of the first conductivity type provided under the second semiconductor region, and a fourth semiconductor region of the first conductivity type provided in a part of a portion between the first semiconductor region and the second semiconductor region, wherein the second semiconductor region has a first region that does not overlap with the third semiconductor region in a plan view, and wherein the fourth semiconductor region overlaps with at least a part of the first region in the plan view.

Further, according to another aspect of the present invention, there is provided a solid-state imaging device including a plurality of pixels, each of the plurality of pixels including a photoelectric converter that generates charges by photoelectric conversion and a charge holding portion that holds charges transferred from the photoelectric converter, wherein the photoelectric converter includes a first semiconductor region of a first conductivity type provided in a surface portion of a semiconductor substrate, a second semiconductor region of a second conductivity type provided under the first semiconductor region and configured to accumulate generated charges, a third semiconductor region of the first conductivity type provided under the second semiconductor region, and a fifth semiconductor region of the second conductivity type provided in a depth between the first semiconductor region and the third semiconductor region, wherein the second semiconductor region is provided in a first region that does not overlap with the third semiconductor region in a plan view and a second region that overlaps with the third semiconductor region in the plan view, and wherein the fifth semiconductor region is provided in a same region as a region in which the third semiconductor region is provided in the plan view.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

A solid-state imaging device according to a first embodiment of the present invention will be described with reference to FIG. 1 to FIG. 6.

Figure 1:
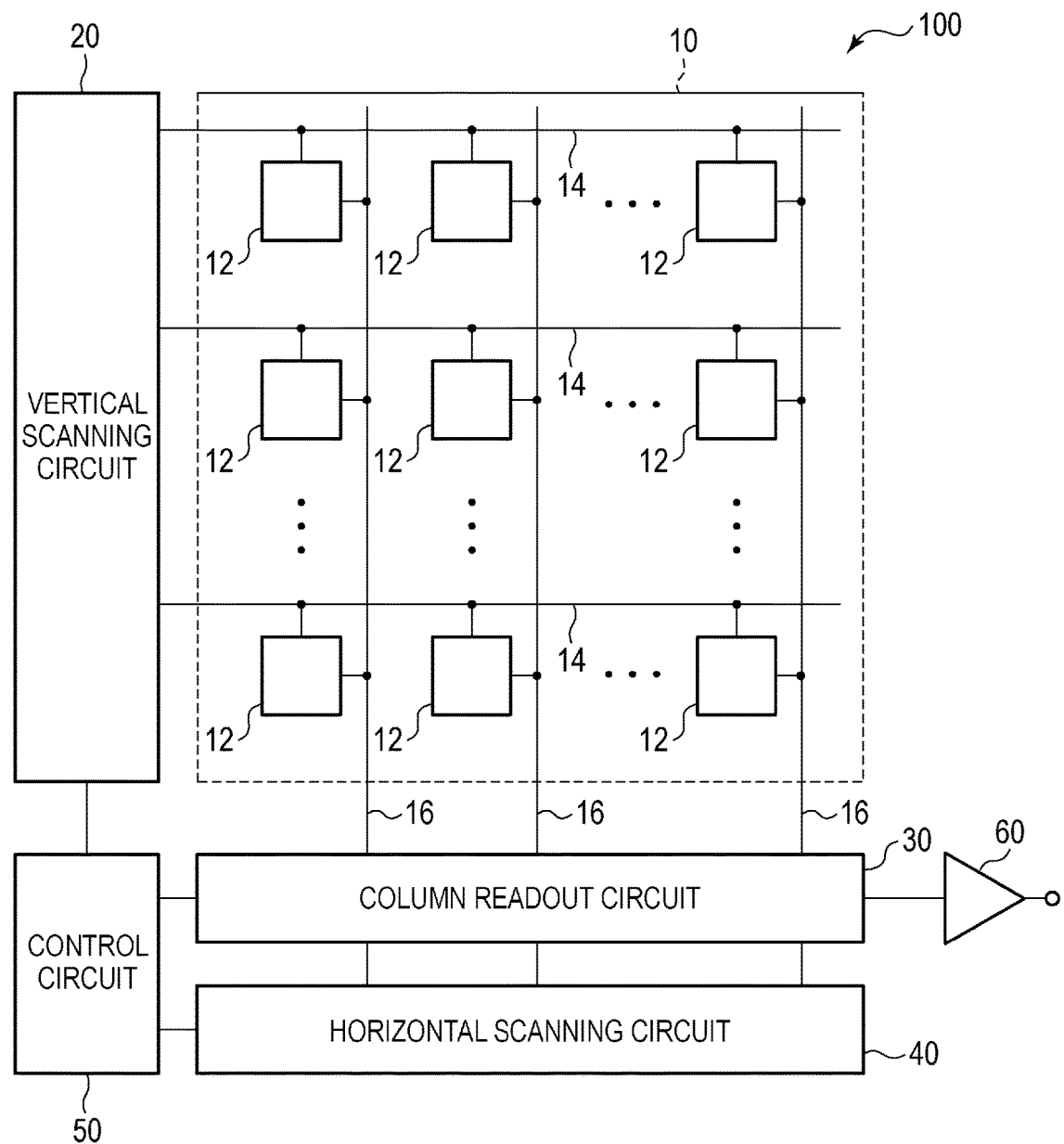
FIG. 1 is a block diagram illustrating a general configuration of a solid-state imaging device according to a first embodiment of the present invention.
Figure 2:
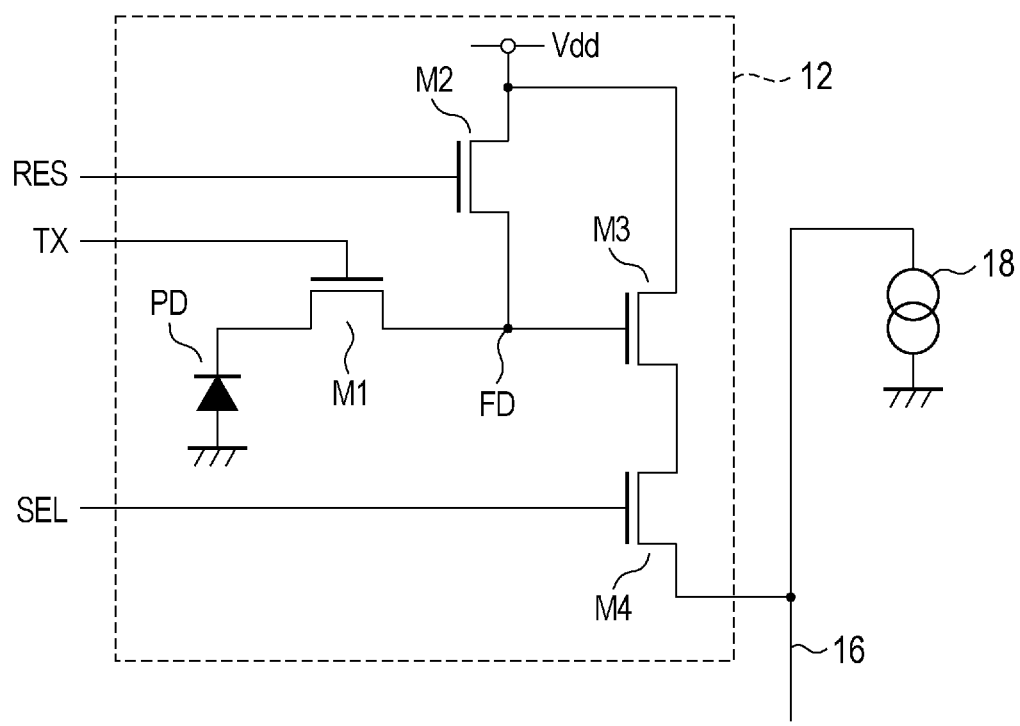
FIG. 2 is an equivalent circuit diagram of a pixel of the solid-state imaging device according to the first embodiment of the present invention.
Figure 3:
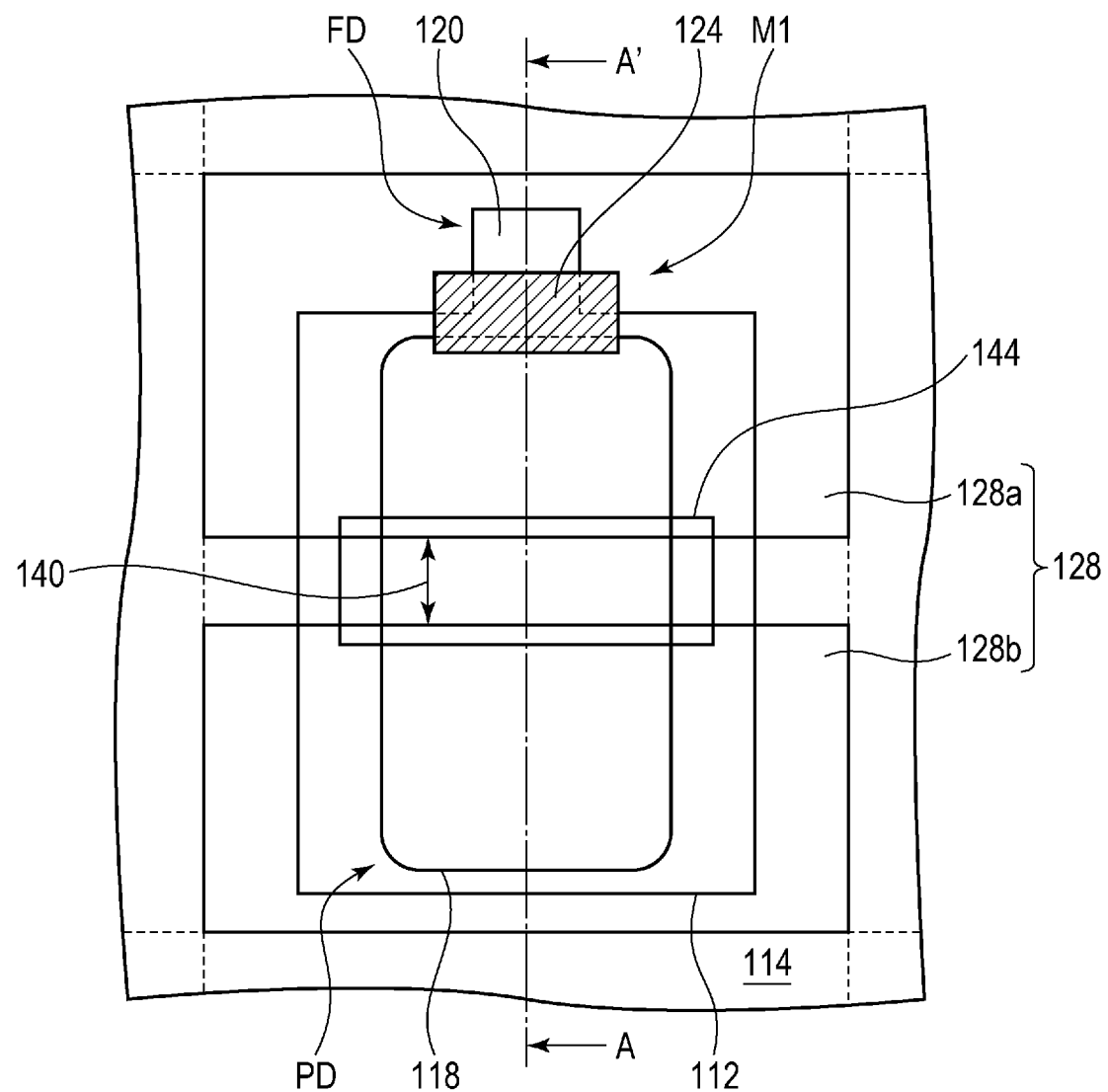
FIG. 3 is a diagram illustrating a planar layout of the pixel of the solid-state imaging device according to the first embodiment of the present invention.
Figure 4:
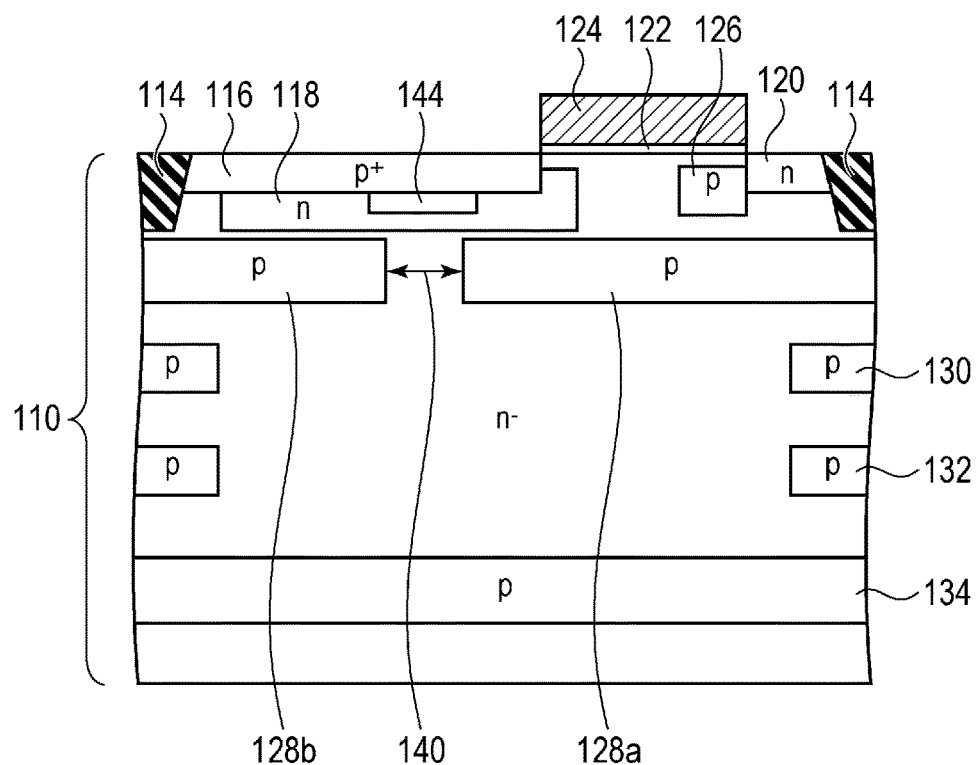
FIG. 4 is a schematic cross-sectional view the pixel of the solid-state imaging device according to the first embodiment of the present invention.
Figure 5:
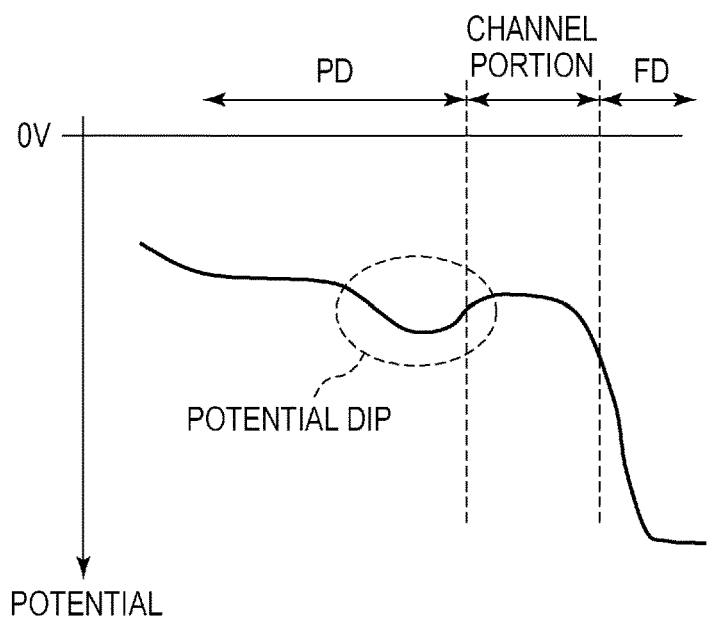
FIG. 5 and FIG. 6 are diagrams of the potential inside a semiconductor substrate when signal charges are transferred.
Figure 6:
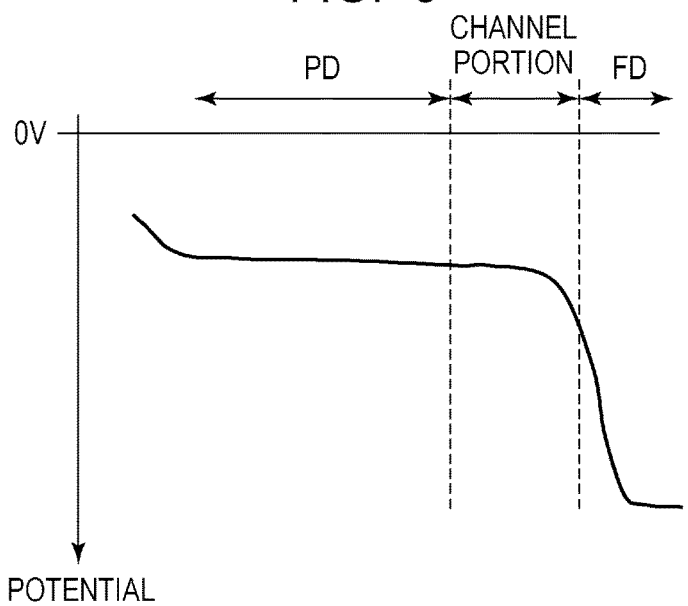

FIG. 1 is a block diagram illustrating a general configuration of a solid-state imaging device according to the present embodiment. FIG. 2 is an equivalent circuit diagram of a pixel of the solid-state imaging device according to the present embodiment. FIG. 3 is a diagram illustrating a planar layout of the pixel of the solid-state imaging device according to the present embodiment. FIG. 4 is a schematic cross-sectional view of the pixel of the solid-state imaging device according to the present embodiment. FIG. 5 and FIG. 6 are diagrams of the potential inside a semiconductor substrate when signal charges are transferred.

As illustrated in FIG. 1, a solid-state imaging device 100 according to the present embodiment includes a pixel region 10, a vertical scanning circuit 20, a column readout circuit 30, a horizontal scanning circuit 40, a control circuit 50, and an output circuit 60.

In the pixel region 10, a plurality of pixels 12 are provided arranged in a matrix over a plurality of rows by a plurality of columns. On each of the rows of a pixel array in the pixel region 10, a control signal line 14 is arranged extending in the row direction (the horizontal direction in FIG. 1). The control signal line 14 is connected to respective pixels 12 aligned in the row direction, which is a signal line common to these pixels 12. Further, on each of the columns of the pixel array in the pixel region 10, a vertical output line 16 is arranged extending in the column direction (the vertical direction in FIG. 1). The vertical output line 16 is connected to respective pixels 12 aligned in the column direction, which is a signal line common to these pixels 12.

The control signal line 14 on each row is connected to the vertical scanning circuit 20. The vertical scanning circuit 20 is a circuit unit that supplies, to the pixels 12 via the control signal lines 14, control signals for driving readout circuits in the pixels 12 when reading out pixel signals from the pixels 12. One end of the vertical output line 16 on each column is connected to the column readout circuit 30. Pixel signals read out from the pixels 12 are input to the column readout circuit 30 via the vertical output lines 16. The column readout circuit 30 is a circuit unit that performs the predetermined pixel signal processing, for example, a signal amplification or an analog-to-digital (AD) conversion. The column readout circuit 30 may include a differential amplifier circuit, a sample-and-hold circuit, an AD conversion circuit, or the like.

The horizontal scanning circuit 40 is a circuit unit that supplies, to the column readout circuit 30, control signals for transferring the pixel signal processed in the column readout circuit 30 to the output circuit 60 sequentially on a column basis. The control circuit 50 is a circuit unit that supplies control signals for controlling operations and the timings of the operations of the vertical scanning circuit 20, the column readout circuit 30, and the horizontal scanning circuit 40. The output circuit 60 is a circuit unit that is formed of a buffer amplifier, a differential amplifier, or the like and outputs the pixel signals read out from the column readout circuit 30 to a signal processing unit outside the solid-state imaging device 100.

As illustrated in FIG. 2, each of the pixels 12 includes a photoelectric converter PD, a transfer transistor M1, a reset transistor M2, an amplifier transistor M3, and a select transistor M4. The photoelectric converter PD is a photodiode, for example, in which the anode thereof is connected to a ground voltage line and the cathode is connected to the source of the transfer transistor M1. The drain of the transfer transistor M1 is connected to the source of the reset transistor M2 and the gate of the amplifier transistor M3. The connection node of the drain of the transfer transistor M1, the source of the reset transistor M2, and the gate of the amplifier transistor M3 forms a so-called floating diffusion (FD) and form a charge-to-voltage converter formed of a capacitance component included in this node. The drain of the reset transistor M2 and the drain of the amplifier transistor M3 are connected to a power source voltage line (Vdd). The source of the amplifier transistor M3 is connected to the drain of the select transistor M4. The source of the select transistor M4 is connected to the vertical output line 16. The other end of the vertical output line 16 is connected to a current source 18.

In a case of the circuit configuration illustrated in FIG. 2, the control signal line 14 includes a transfer gate signal line TX, a reset signal line RES, and a select signal line SEL. The transfer gate signal line TX is connected to the gates of the transfer transistors M1. The reset signal line RES is connected to the gates of the reset transistors M2. The select signal line SEL is connected to the gates of the select transistors M4.

The photoelectric converter PD converts (photoelectrically converts) an incident light into signal charges of an amount in accordance with the light amount and accumulates the generated charges. When turned on, the transfer transistor M1 transfers charges of the photoelectric converter PD to the floating diffusion FD. The floating diffusion FD becomes a voltage corresponding to the amount of charges transferred from the photoelectric converter PD through charge-to-voltage conversion with the floating diffusion capacitor. The amplifier transistor M3 is configured such that the power source voltage Vdd is supplied to the drain and a bias current is supplied to the source from the current source 18 via the select transistor M4 to form an amplifier unit (a source follower circuit) in which the gate is the input node. Thereby, the amplifier transistor M3 outputs a signal based on the voltage of the floating diffusion FD to the vertical output line 16 via the select transistor M4. When turned on, the reset transistor M2 resets the floating diffusion FD to a voltage corresponding to the power source voltage Vdd.

FIG. 3 is a diagram illustrating a planar layout of the pixel 12 of the solid-state imaging device according to the present embodiment. FIG. 4 is a schematic cross-sectional view taken along a line A-A' of FIG. 3. Note that, while FIG. 3 illustrates only the planar layout of one pixel 12, the planar layout of FIG. 3 is repeated periodically at a predetermined unit pixel pitch in the horizontal direction and the vertical direction in the actual implementation. The dotted lines illustrated in FIG. 3 are an example of boundary lines between the neighboring pixels 12.

An element isolation insulating region 114 defining an active region 112 is provided in the surface portion of an n-type semiconductor substrate 110 having a low impurity concentration. In the active region 112, arranged are a photodiode forming the photoelectric converter PD, the transfer transistor M1, and the floating diffusion FD as a charge holding portion that holds charges transferred from the photoelectric converter PD.

The photoelectric converter PD is an embedded photodiode that includes a p-type semiconductor region 116 (first semiconductor region) provided in the surface portion of the active region 112 of the semiconductor substrate 110 and an n-type semiconductor region 118 (second semiconductor region) provided adjacent to the lower portion of the p-type semiconductor region 116. The n-type semiconductor region 118 is a charge accumulation layer for accumulating signal charges (electrons) generated by the photoelectric converter PD.

The floating diffusion FD is formed of an n-type semiconductor region 120 provided, spaced apart from the n-type semiconductor region 118, in the surface portion of the active region 112 of the semiconductor substrate 110.

The transfer transistor M1 includes a gate electrode 124 provided over the semiconductor substrate 110 between the n-type semiconductor region 118 and the n-type semiconductor region 120 with a gate insulating film 122 interposed therebetween. A p-type semiconductor region 126 for electrical isolation of the n-type semiconductor region 118 and the n-type semiconductor region 120 is provided inside the semiconductor substrate 110 between the n-type semiconductor region 118 and the n-type semiconductor region 120.

A p-type semiconductor region 128 (third semiconductor region) as a depletion suppression layer for suppressing a depletion layer from expanding downward from the n-type semiconductor region 118 is provided under the n-type semiconductor region 118. As an example here, the p-type semiconductor region 128 is formed by a stripe pattern extending in the row direction (the horizontal direction in FIG. 3) in a plan view. FIG. 3 illustrates two adjacent stripe-patterned p-type semiconductor regions 128a and 128b and a gap 140 therebetween. Note that the plan view in the present specification is a two-dimensional planar view obtained by projecting respective components of the solid-state imaging device on a plane parallel to the surface of the semiconductor substrate 110 and, for example, corresponds to a planar layout view of FIG. 3.

At least a part of the region of the n-type semiconductor region 118 overlaps with a region where no p-type semiconductor region 128 is provided, that is, overlaps with the gap 140 in the plan view. That is, the n-type semiconductor region 118 has a region (first region) which does not overlap with the p-type semiconductor region 128 in the plan view and a region (second region) which overlaps with the p-type semiconductor region 128 in the plan view. The region where the n-type semiconductor region 118 and the gap 140 overlap with each other in the plan view is preferably arranged in a portion where the potential of the n-type semiconductor region 118 is the highest, typically, the center portion of the n-type semiconductor region 118 in the plan view. Further, while not limited in particular, the planar layout of the gap 140 is preferably arranged so as to traverse the n-type semiconductor region 118 in the plan view as illustrated in the example of FIG. 3, for example. In this case, it can be said that the region (third region) where the n-type semiconductor region 118 and the p-type semiconductor region 128a are overlapped in the plan view and the region (fourth region) where the n-type semiconductor region 118 and the p-type semiconductor region 128b are overlapped in the plan view are spaced apart from each other.

As illustrated in FIG. 3, a p-type semiconductor region 144 (fourth semiconductor region) is provided over the entire region where the n-type semiconductor region 118 and the gap 140 are overlapped in the plan view. As illustrated in FIG. 4, the p-type semiconductor region 144 is provided between the p-type semiconductor region 116 and the n-type semiconductor region 118 in a cross-sectional view. The upper part of the p-type semiconductor region 144 is in contact with the lower part of the p-type semiconductor region 116, and the p-type semiconductor region 144 is provided inside the semiconductor substrate 110 shallower than the lower part of the n-type semiconductor region 118.

In a deep portion of the semiconductor substrate 110, p-type semiconductor regions 130, 132, and 134 are provided. The p-type semiconductor region 130 is responsible for isolation between pixels 12 inside the semiconductor substrate 110. The p-type semiconductor region 132 is responsible for isolation between pixels 12 inside the semiconductor substrate 110 which is deeper than the p-type semiconductor region 130. The p-type semiconductor region 134 (seventh semiconductor region) is provided for defining a depth at which signal charges generated in the semiconductor substrate 110 are effectively collected. Note that, in the present specification, the surface of the semiconductor substrate 110 electrically isolated by the p-type semiconductor region 126 may be called a semiconductor region (sixth semiconductor region).

With the p-type semiconductor region 128 being provided under the n-type semiconductor region 118, a p-n junction capacitor is formed between the n-type semiconductor region 118 and the p-type semiconductor region 128. As is apparent from the relational expression represented by Q=CV, when a predefined reverse bias voltage V is applied to the p-n junction of the photoelectric converter PD, a larger p-n junction capacitance C results in a larger accumulated charge amount Q. While signal charges accumulated in the n-type semiconductor region 118 are transferred to the signal output unit, after the potential of the n-type semiconductor region 118 reaches a predetermined potential that is defined by the power source voltage or the like, the signal charges of the n-type semiconductor region 118 are no longer transferred. That is, since the variation amount of the voltage V due to the transfer of signal charges is predefined, the saturation charge amount increases proportional to the p-n junction capacitance of the photoelectric converter PD. Therefore, by providing the p-type semiconductor region 128, it is possible to increase the saturation charge amount of the n-type semiconductor region 118 as a charge accumulation layer.

Further, the gap 140 between the p-type semiconductor region 128a and the p-type semiconductor region 128b forms a flowing path of signal charges when signal charges generated inside the semiconductor substrate 110 between the n-type semiconductor region 118 and the p-type semiconductor region 134 are collected into the n-type semiconductor region 118. Therefore, appropriate setting of the size or the shape of the gap 140 or the impurity concentration of the p-type semiconductor region 128 allows signal charges generated inside the semiconductor substrate 110 between the n-type semiconductor region 118 and the p-type semiconductor region 134 to be effectively collected into the n-type semiconductor region 118. That is, the same sensitivity as the sensitivity which would be obtained in the structure without the p-type semiconductor region 128 can be obtained.

Note that, in a planar layout illustrated in FIG. 3, the gap 140 between the p-type semiconductor region 128a and the p-type semiconductor region 128b is spaced from the corner portions of the n-type semiconductor region 118. Thus, the shape of the overlapping portion of the n-type semiconductor region 118 and the gap 140 in the plan view does not change even when the positions among the n-type semiconductor region 118 and the p-type semiconductor region 128 are shifted to some extent. That is, since a constant sensitivity can be obtained regardless of variation at the formation, both of a high sensitivity and a large saturation charge amount can be achieved. Further, with the gap 140 being arranged so as to traverse the n-type semiconductor region 118 in the plan view, this can prevent the corner portions of the gap 140 from being located within the region where the n-type semiconductor region 118 and the gap 140 overlap with each other, and a change in the sensitivity due to variation at the formation can be further suppressed.

FIG. 5 and FIG. 6 are diagrams illustrating the potential distribution of a portion from the photoelectric converter PD (the n-type semiconductor region 118) to the floating diffusion FD (the n-type semiconductor region 120) via a channel portion when the transfer transistor M1 is in an on-state. FIG. 5 corresponds to a case where no p-type semiconductor region 144 is provided. FIG. 6 corresponds to a case where the p-type semiconductor region 144 is provided.

When the p-type semiconductor region 128 is arranged under the n-type semiconductor region 118, a relatively larger potential dip occurs in the photoelectric converter PD as illustrated in FIG. 5 resulting in a reduction in the transfer performance. This potential dip occurs correspondingly to a portion of the p-type semiconductor region 128 where the gap 140 is provided. This is because depletion is less likely to occur with respect to the same potential in the overlapping portion of the n-type semiconductor region 118 and the gap 140 compared to the overlapping portion of the n-type semiconductor region 118 and the p-type semiconductor region 128 in the plan view. Signal charges are likely to be retained in such a potential dip, which appears as a reduction in the transfer performance at a transfer operation.

In such a point of view, in the solid-state imaging device according to the present embodiment, the p-type semiconductor region 144 is provided inside the n-type semiconductor region 118 in a location substantially overlapping with the gap 140 in the plan view. With the p-type semiconductor region 144 being provided, it is possible to reduce the potential dip in the n-type semiconductor region 118 in a portion where the gap 140 is provided, as illustrated in FIG. 6. This can suppress signal charges from being retained in the potential dip and improve the transfer performance.

Further, in the solid-state imaging device according to the present embodiment, the p-type semiconductor region 144 is arranged so as to cover the entire overlapping region of the n-type semiconductor region 118 and the gap 140 in the plan view, as illustrated in FIG. 3. Therefore, even when the positions of the n-type semiconductor region 118, the p-type semiconductor region 128, and the p-type semiconductor region 144 are shifted to some extent, the p-type semiconductor region 144 can be arranged over the entire overlapping portion of the n-type semiconductor region 118 and the gap 140 in the plan view. Therefore, regardless of variation at the formation, a constant transfer performance can be achieved.

As discussed above, according to the present embodiment, it is possible to improve the transfer performance of signal charges while achieving both a high sensitivity and a large saturation charge amount of the photoelectric converter. This can realize a high-performance solid-state imaging device having a high sensitivity and a large saturation signal amount in a stable manner.

Second Embodiment

A solid-state imaging device according to a second embodiment of the present invention will be described with reference to FIG. 7 to FIG. 9. The same components as those in the solid-state imaging device according to the first embodiment are labeled with the same reference symbols, and the description thereof will be omitted or simplified.

Figure 7:
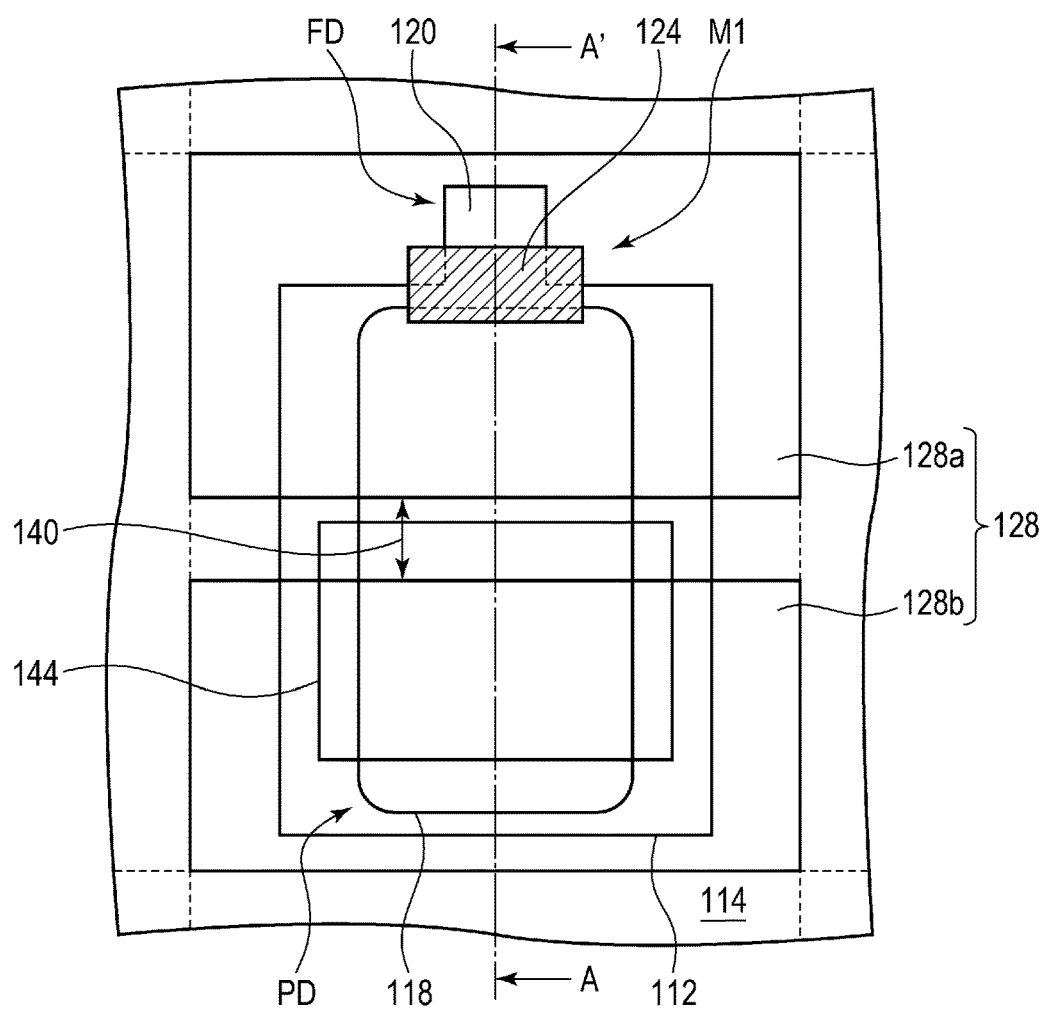
FIG. 7 is a diagram illustrating a planar layout of a pixel of a solid-state imaging device according to a second embodiment of the present invention.

FIG. 7 is a diagram illustrating a planar layout of a pixel of the solid-state imaging device according to the present embodiment. FIG. 8 is a schematic cross-sectional view of the pixel of the solid-state imaging device according to the present embodiment. FIG. 9 is a diagram of the potential within the semiconductor substrate when signal charges are transferred.

Figure 8:
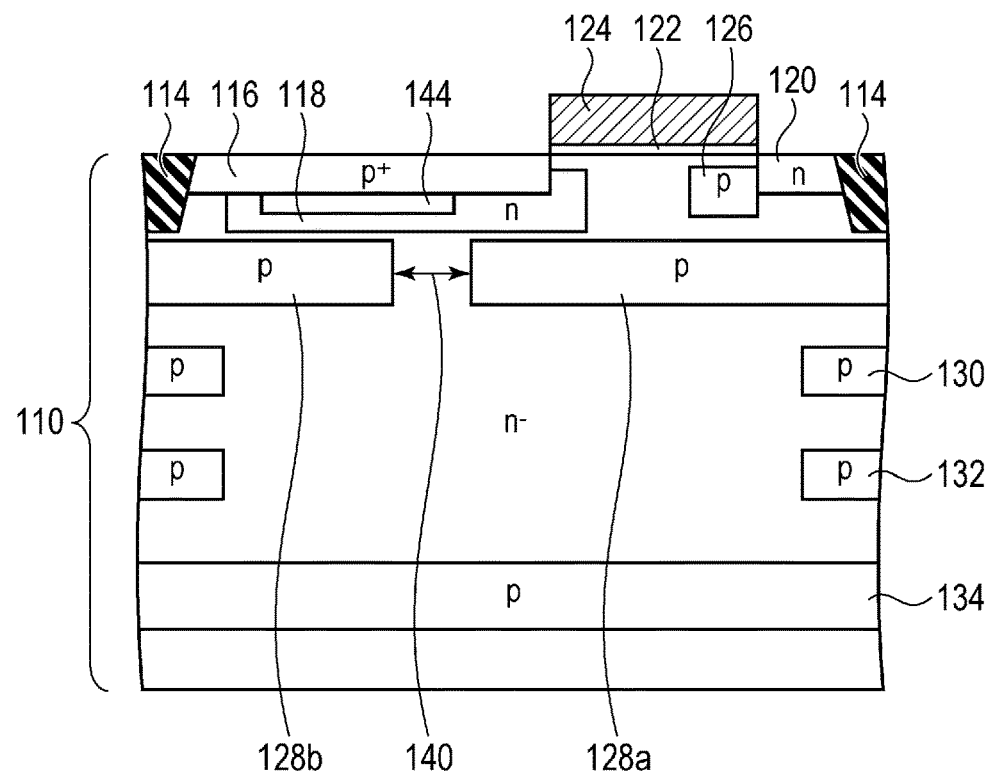
FIG. 8 is a schematic cross-sectional view of the pixel of the solid-state imaging device according to the second embodiment of the present invention.

The solid-state imaging device according to the present embodiment is the same as the solid-state imaging device of the first embodiment except that the location of the p-type semiconductor region 144 in the plan view is different, as illustrated in FIG. 7 and FIG. 8. That is, in the solid-state imaging device according to the first embodiment, the p-type semiconductor region 144 is arranged so as to cover the entire overlapping region of the n-type semiconductor region 118 and the gap 140 in the plan view as illustrated in FIG. 3. In contrast, the solid-state imaging device according to the present embodiment, from the overlapping region of the n-type semiconductor region 118 and the gap 140, the p-type semiconductor region 144 extends in the direction in which the distance from the gate electrode 124 increases in the plan view. The depth in which the p-type semiconductor region 144 is provided is the same in the first embodiment and the present embodiment.

Note that, in FIG. 7 and FIG. 8, the p-type semiconductor region 144 is not arranged so as to cover the entire overlapping region of the n-type semiconductor region 118 and the gap 140 in the plan view but may be arranged so as to cover the entire overlapping region of the n-type semiconductor region 118 and the gap 140.

Figure 9:
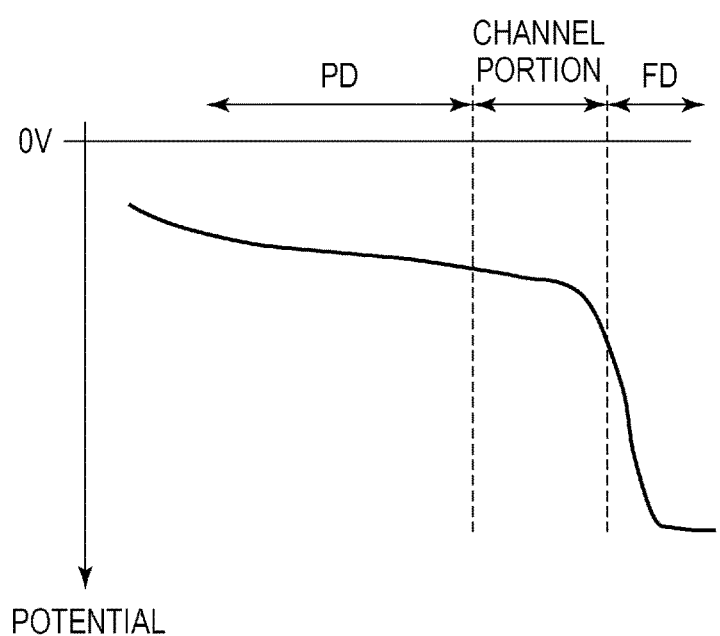
FIG. 9 is a diagram of the potential inside a semiconductor substrate when signal charges are transferred.

FIG. 9 is a diagram illustrating the potential distribution of a portion from the photoelectric converter PD (the n-type semiconductor region 118) to the floating diffusion FD (the n-type semiconductor region 120) via a channel portion when the transfer transistor M1 is in an on-state. In the solid-state imaging device according to the present embodiment, the p-type semiconductor region 144 extends in the direction in which the distance from the gate electrode 124 of the transfer transistor M1 increases. Thereby, the potential of the photoelectric converter PD inclines from a position spaced away from the gate electrode 124 to the floating diffusion FD side.

In general, signal charges generated in a position near a channel portion is subjected to a significant influence of the electric field of the floating diffusion FD portion and can be transferred at a high efficiency by the drift force due to the electric field. On the other hand, in a position away from a transfer portion, the potential is flat as illustrated in FIG. 6, for example, and the generated charges move mainly by diffusion.

In this regard, in the solid-state imaging device according to the present embodiment, since the p-type semiconductor region 144 extends in the direction in which the distance from the gate electrode 124 of the transfer transistor M1 increases, the transfer performance can be further improved by the drift force due to the electric field caused by the potential difference.

As discussed above, according to the present embodiment, it is possible to improve the transfer performance of signal charges while achieving both a high sensitivity and a large saturation charge amount of the photoelectric converter. This can realize a high-performance solid-state imaging device having a high sensitivity and a large saturation signal amount in a stable manner.

Third Embodiment

A solid-state imaging device according to a third embodiment of the present invention will be described with reference to FIG. 10 and FIG. 11. The same components as those in the solid-state imaging devices according to the first and second embodiments are labeled with the same reference symbols, and the description thereof will be omitted or simplified.

Figure 10:
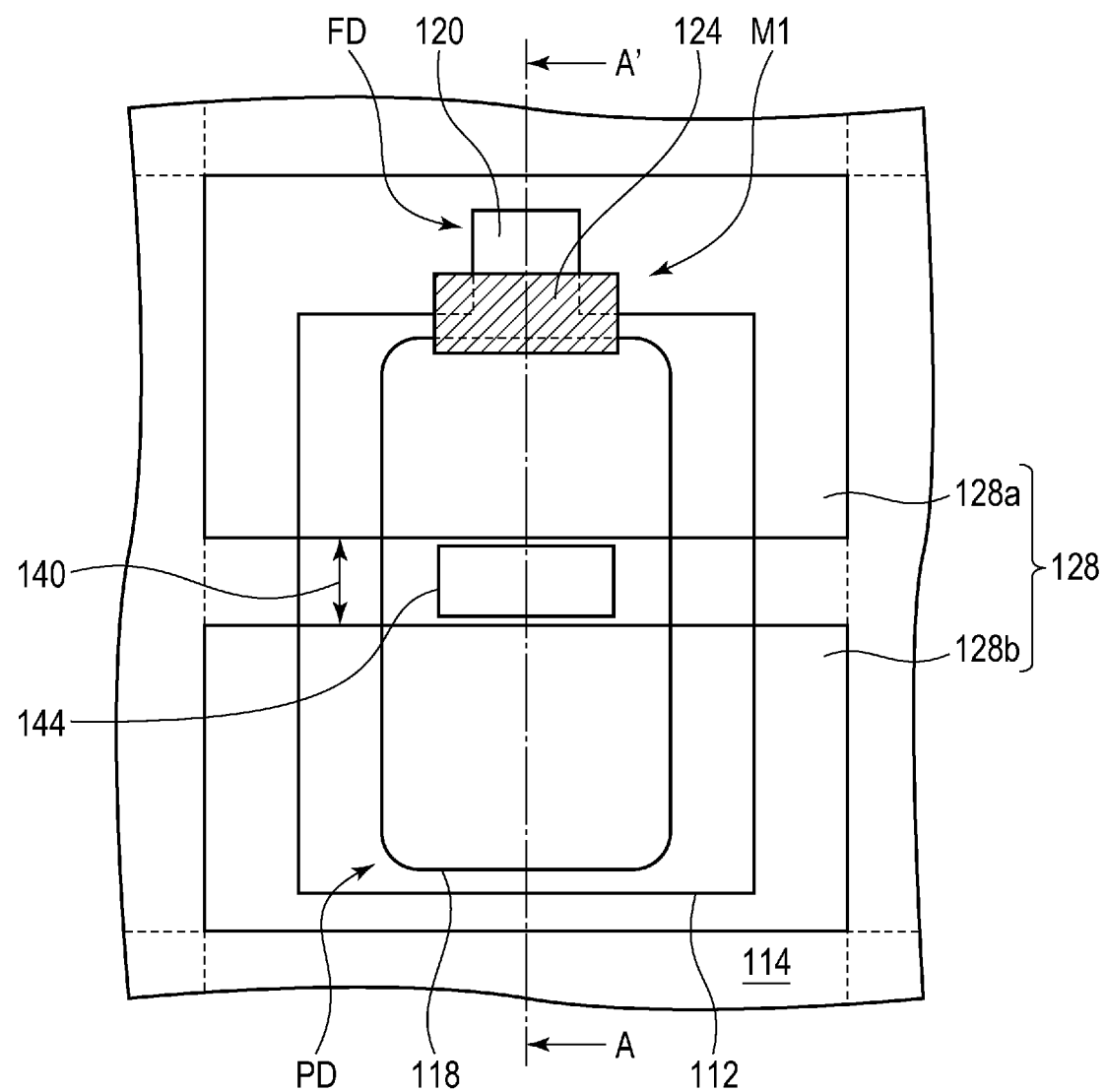
FIG. 10 is a diagram illustrating a planar layout of a pixel of a solid-state imaging device according to a third embodiment of the present invention.

FIG. 10 is a diagram illustrating a planar layout of a pixel of the solid-state imaging device according to the present embodiment. FIG. 11 is a schematic cross-sectional view of the pixel of the solid-state imaging device according to the present embodiment.

Figure 11:
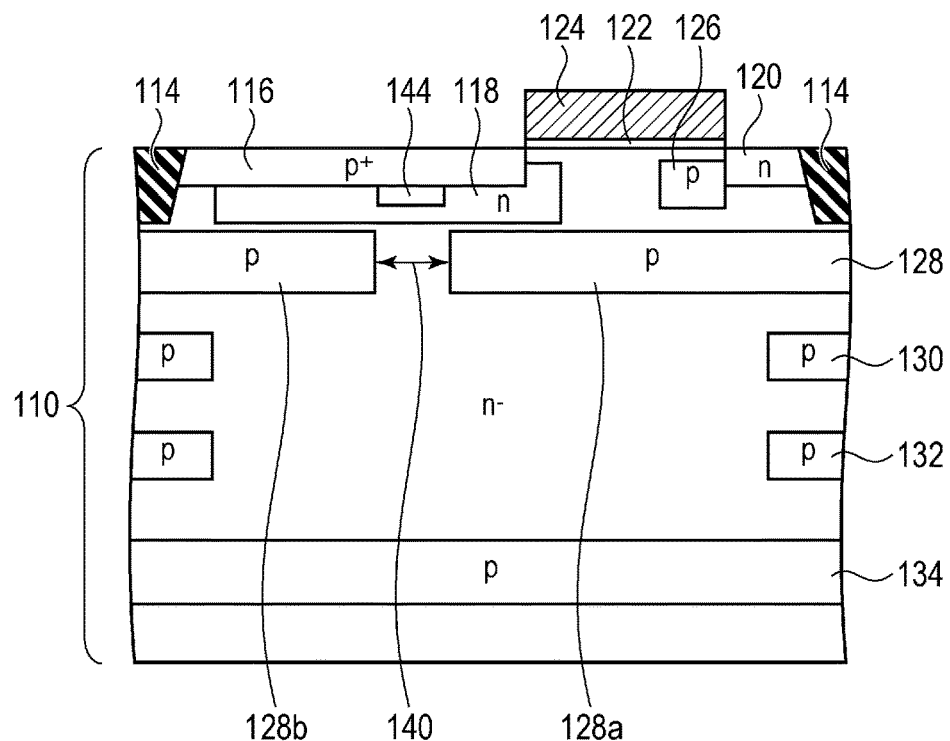
FIG. 11 is a schematic cross-sectional view of the pixel of the solid-state imaging device according to the third embodiment of the present invention.

The solid-state imaging device according to the present embodiment is the same as the solid-state imaging device of the first embodiment except that the location of the p-type semiconductor region 144 in the plan view is different, as illustrated in FIG. 10 and FIG. 11. That is, in the solid-state imaging device according to the first embodiment, the p-type semiconductor region 144 is arranged so as to cover the entire overlapping region of the n-type semiconductor region 118 and the gap 140 in the plan view as illustrated in FIG. 3. In contrast, in the solid-state imaging device according to the present embodiment, the p-type semiconductor region 144 is arranged inside the overlapping region of the n-type semiconductor region 118 and the gap 140 in the plan view. That is, the p-type semiconductor region 144 of the present embodiment has a shape that is slightly smaller than the shape of the overlapping portion of the n-type semiconductor region 118 and the gap 140 in the plan view. The depth in which the p-type semiconductor region 144 is provided is the same in the first embodiment and the present embodiment.

The center portion of the n-type semiconductor region 118 has the highest potential even when no p-type semiconductor region 128 is provided and therefore is a position where a potential dip is likely to occur. In the present embodiment, the impurity concentration or the depth of the p-type semiconductor region 144 is optimized in accordance with a potential dip that varies with the location or the like of the n-type semiconductor region 118, the p-type semiconductor region 128, and the gap 140. This allows for reducing the shape of the p-type semiconductor region 144 in the plan view to be smaller than the gap 140.

Further, providing the p-type semiconductor region 144 within the n-type semiconductor region 118 is to narrow the area of the n-type semiconductor region 118 as a charge accumulation layer and leads to a reduction in the saturation charge amount of the photoelectric converter PD. It is effective to reduce the shape of the p-type semiconductor region 144 in the plan view in achieving a high sensitivity and a good transfer performance without unduly reducing the saturation charge amount of the photoelectric converter PD.

As discussed above, according to the present embodiment, it is possible to improve the transfer performance of signal charges while achieving both a high sensitivity and a large saturation charge amount of the photoelectric converter. This can realize a high-performance solid-state imaging device having a high sensitivity and a large saturation signal amount in a stable manner.

Fourth Embodiment

A solid-state imaging device according to a fourth embodiment of the present invention will be described with reference to FIG. 12. The same components as those in the solid-state imaging devices according to the first to third embodiments are labeled with the same reference symbols, and the description thereof will be omitted or simplified.

Figure 12:
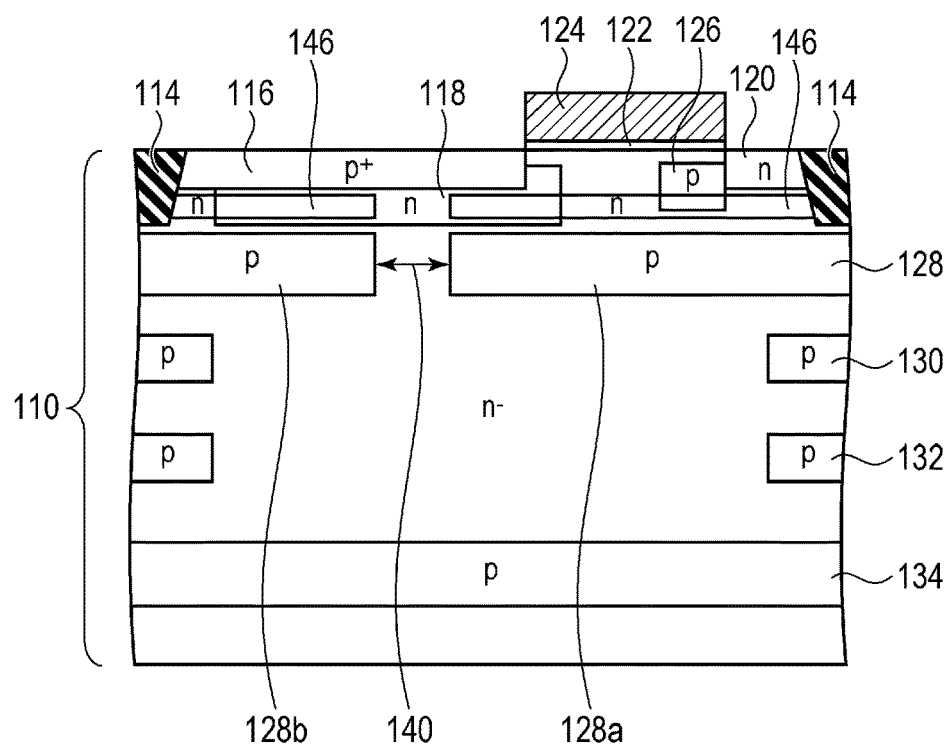
FIG. 12 is a schematic cross-sectional view of a pixel of a solid-state imaging device according to a fourth embodiment of the present invention.

FIG. 12 is a schematic cross-sectional view of a pixel of the solid-state imaging device according to the present embodiment.

Figure 13:
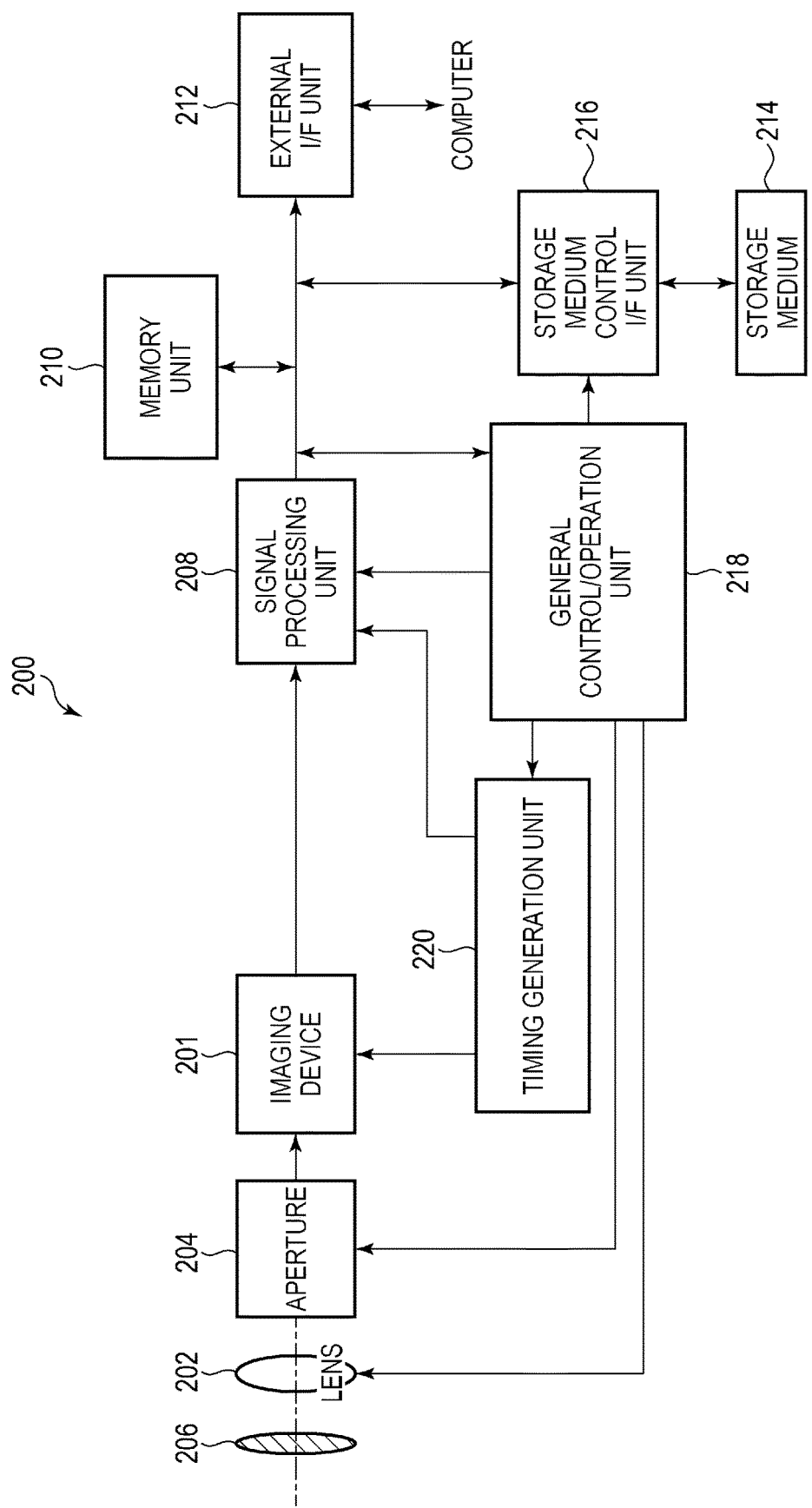
FIG. 13 is a block diagram illustrating a general configuration of an imaging system according to a fifth embodiment of the present invention.

The solid-state imaging device according to the present embodiment is the same as the solid-state imaging devices of the first to third embodiments except that the n-type semiconductor region 146 (fifth semiconductor region) is provided instead of the p-type semiconductor region 144, as illustrated in FIG. 13. The n-type semiconductor region 146 is provided in the depth between the p-type semiconductor region 116 and the p-type semiconductor region 128 in a region that is substantially the same as the region in the plan view where the p-type semiconductor region 128 is provided. The n-type semiconductor region 146 is located in substantially the same depth as the n-type semiconductor region 118. Note that substantially the same region intends that the n-type semiconductor region 146 and the p-type semiconductor region 128 are formed by using ion implantation using the same mask pattern.

The impurity concentration of the n-type semiconductor region 118 is set such that, for example, substantially the same saturation charge amount as that in the case where no n-type semiconductor region 146 is provided can be obtained. Thus, the impurity concentration of the n-type semiconductor region 118 in the solid-state imaging device of the present embodiment is lower than the impurity concentration of the n-type semiconductor region 118 in the solid-state imaging device of the first embodiment. Since no n-type semiconductor region 146 is provided in a portion overlapping with the gap 140 in the plan view, a potential dip is less likely to be formed in the n-type semiconductor region 118 of a portion where the gap 140 is provided, and thus the amount of transferrable signal charges can be increased.

Moreover, in the present embodiment, it is possible to form the p-type semiconductor region 128 and the n-type semiconductor region 146 by using the same mask step and therefore omit one step from photolithography steps compared to the case of the first to third embodiments. That is, the manufacturing cost can be reduced. Further, no displacement occurs in the positioning between the p-type semiconductor region 128 and the n-type semiconductor region 146, and therefore a stable saturation charge amount, stable transfer characteristics, and stable sensitivity characteristics can be obtained.

As discussed above, according to the present embodiment, it is possible to improve the transfer performance of signal charges while achieving both a high sensitivity and a large saturation charge amount of the photoelectric converter. This can realize a high-performance solid-state imaging device having a high sensitivity and a large saturation signal amount in a stable manner.

Fifth Embodiment

An imaging system according to a fifth embodiment of the present invention will be described with reference to FIG. 13. The same components as those in the solid-state imaging devices according to the first to fourth embodiments are labeled with the same reference symbols, and the description thereof will be omitted or simplified. FIG. 13 is a block diagram illustrating a general configuration of the imaging system of the present embodiment.

The solid-state imaging devices 100 described in the above first to fourth embodiments can be applied to various imaging systems. Examples of the applicable imaging systems may include a digital still camera, a digital camcorder, a surveillance camera, a copier machine, a fax machine, a mobile phone, an on-vehicle camera, an observation satellite, and the like. Further, a camera module having an optical system, such as a lens, and an imaging device may be included in the imaging system. FIG. 13 illustrates a block diagram of a digital still camera as an example of the above.

The imaging system 200 illustrated as an example in FIG. 13 includes an imaging device 201, a lens 202 that captures an optical image of a subject onto the imaging device 201, an aperture 204 for changing a light amount passing through the lens 202, and a barrier 206 for protecting the lens 202. The lens 202 and the aperture 204 form an optical system that converges a light onto the imaging device 201. The imaging device 201 is the solid-state imaging device 100 described in the first to forth embodiments and converts an optical image captured by the lens 202 into image data.

The imaging system 200 further includes a signal processing unit 208 that processes an output signal output from the imaging device 201. The signal processing unit 208 performs AD conversion that converts an analog signal output from the imaging device 201 into a digital signal. Further, the signal processing unit 208 performs other operations of performing various correction or compression if necessary and outputting image data. An AD conversion unit that is a part of the signal processing unit 208 may be formed on the semiconductor substrate in which the imaging device 201 is provided, or may be formed on a different semiconductor substrate from the imaging device 201. Further, the imaging device 201 and the signal processing unit 208 may be formed on the same semiconductor substrate.

The imaging system 200 further includes a memory unit 210 for temporarily storing image data therein and an external interface unit (external I/F unit) 212 for communicating with an external computer or the like. The imaging system 200 further includes a storage medium 214 such as a semiconductor memory for performing storage or readout of image pickup data and a storage medium control interface unit (storage medium control I/F unit) 216 for performing storage or readout on the storage medium 214. Note that the storage medium 214 may be embedded in the imaging system 200 or may be removable.

The imaging system 200 further includes a general control/operation unit 218 that performs various computation and controls the entire digital still camera and a timing generation unit 220 that outputs various timing signals to the imaging device 201 and the signal processing unit 208. Here, the timing signal or the like may be input from the outside, and the imaging system 200 may have at least the imaging device 201 and the signal processing unit 208 that processes an output signal output from the imaging device 201.

The imaging device 201 outputs an imaging signal to the signal processing unit 208. The signal processing unit 208 performs predetermined signal processing on an imaging signal output from the imaging device 201 and outputs image data. Further, the signal processing unit 208 uses an imaging signal to generate an image.

Application of the solid-state imaging device 100 of any of the first to fourth embodiments can realize an imaging system that can acquire a good quality image with a high sensitivity and a large saturation signal amount in a stable manner.

Sixth Embodiment

Figure 14A:
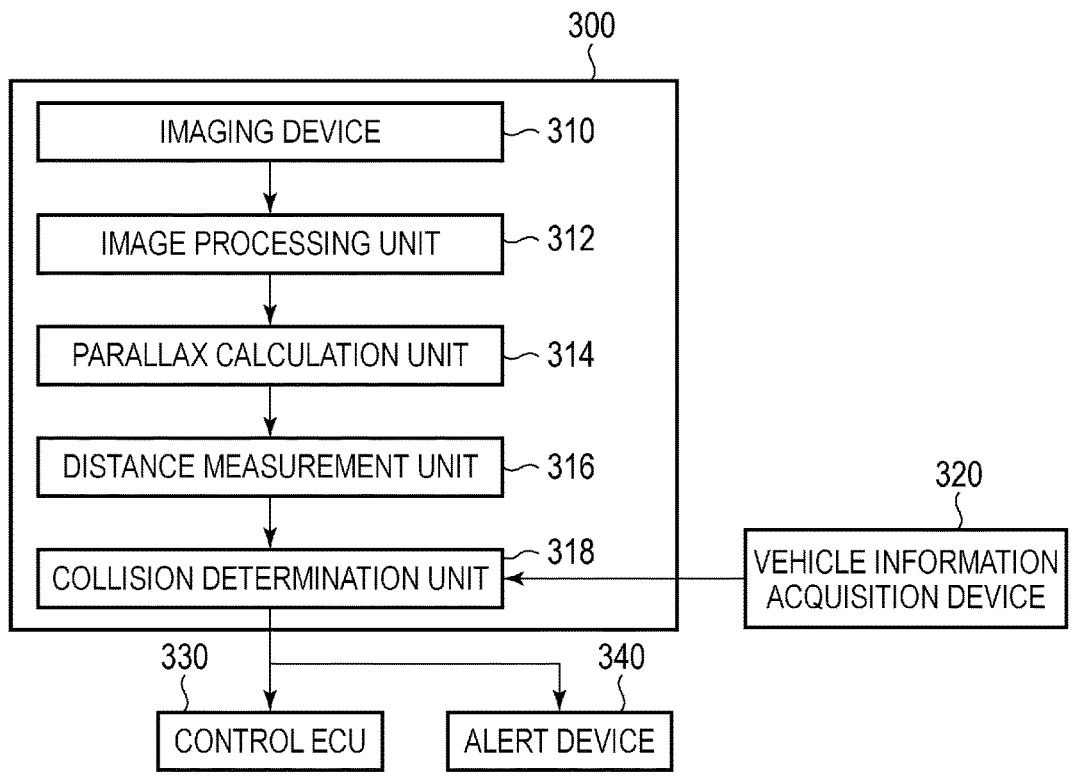
FIG. 14A is a diagram illustrating an example configuration of an imaging system according to a sixth embodiment of the present invention.
Figure 14B:
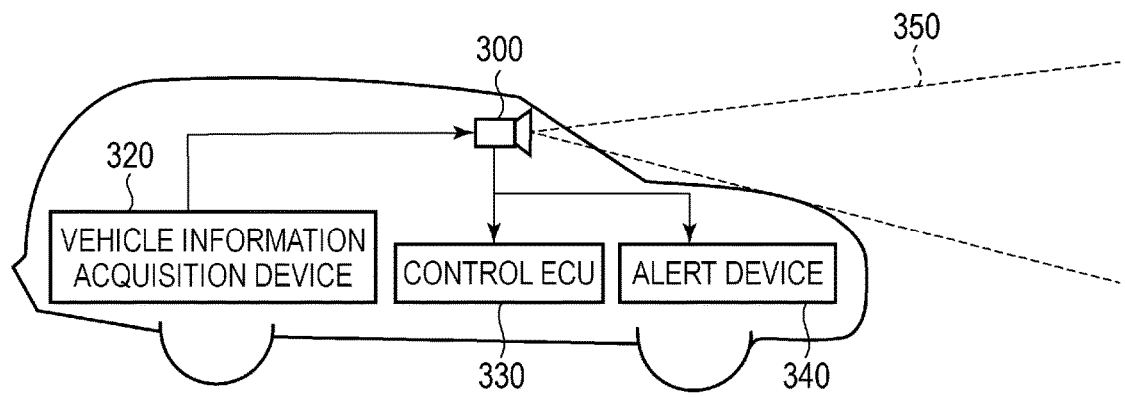
FIG. 14B is a diagram illustrating an example configuration of a movable object according to the sixth embodiment of the present invention.

An imaging system and a movable object according to a sixth embodiment of the present invention will be described with reference to FIG. 14A and FIG. 14B. FIG. 14A is a diagram illustrating a configuration of the imaging system according to the present embodiment. FIG. 14B is a diagram illustrating a configuration of the movable object according to the present embodiment.

FIG. 14A illustrates an example of the imaging system regarding an on-vehicle camera. The imaging system 300 includes an imaging device 310. The imaging device 310 is any of the solid-state imaging devices 100 described in the above first to forth embodiments. The imaging system 300 includes an image processing unit 312 that performs image processing on a plurality of image data acquired by the imaging device 310 and a parallax calculation unit 314 that calculates a parallax (a phase difference of parallax images) from the plurality of image data acquired by the imaging system 300. Further, the imaging system 300 includes a distance measurement unit 316 that calculates a distance to the object based on the calculated parallax and a collision determination unit 318 that determines whether or not there is a collision possibility based on the calculated distance. Here, the parallax calculation unit 314 and the distance measurement unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like, or may be implemented by combination thereof.

The imaging system 300 is connected to the vehicle information acquisition device 320 and can acquire vehicle information such as a vehicle speed, a yaw rate, a steering angle, or the like. Further, the imaging system 300 is connected with a control ECU 330, which is a control device that outputs a control signal for causing a vehicle to generate braking force based on a determination result by the collision determination unit 318. Further, the imaging system 300 is connected with an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 14B illustrates the imaging system in a case of capturing a front area of a vehicle (a capturing area 350). The vehicle information acquisition device 320 transmits instructions to the imaging system 300 or the imaging device 310. Such a configuration can further improve the ranging accuracy.

Although the example of control for avoiding a collision to another vehicle has been illustrated in the above description, the embodiment is applicable to automatic driving control for following another vehicle, automatic driving control for not going out of a traffic lane, or the like. Furthermore, the imaging system is not limited to a vehicle such as the subject vehicle, and can be applied to a movable object (moving apparatus) such as a ship, an airplane, or an industrial robot, for example. In addition, the imaging system can be widely applied to any device which utilizes object recognition, such as an intelligent transportation system (ITS), without being limited to movable objects.

Modified Embodiments

The present invention is not limited to the above-described embodiments, but various modifications are possible.

For example, the embodiment of the present invention includes an example in which a part of the configuration of any of the embodiments is added to another embodiment and an example in which a part of the configuration of any of the embodiments is replaced with a part of the configuration of another embodiment.

Further, although the examples of the solid-state imaging devices using the photoelectric converter PD that generates electrons as signal charges have been described in the above-described embodiments, the invention can be applied in a similar manner to a solid-state imaging device using a photoelectric converter PD that generates holes as signal charges. In this case, the conductivity type of the semiconductor region forming respective portions of the pixel 12 is the opposite conductivity type. Note that the names of the source and the drain of the transistors described in the above embodiments may be different in accordance with the conductivity type, a focused function, or the like of the transistors, and all or some of the sources and the drains described above may be described by opposite names.

Further, the circuit configuration of the pixel 12 illustrated in FIG. 2 is an example and can be changed as appropriate. The pixel 12 may be any pixel as long as it has at least the photoelectric converter PD and the transfer transistor M1 that transfers charges from the photoelectric converter PD to the charge holding portion. The present invention can be applied not only to a CMOS image sensor but also to a CCD image sensor. Further, the charge holding portion to which charges are transferred from the photoelectric converter PD is not necessarily required to be the floating diffusion FD as an input node of the amplifier unit, but may be a charge holding portion separate from the photoelectric converter PD and the floating diffusion FD.

Further, while the example when the n-type substrate structure is applied as the structure of the substrate in which the photoelectric converter is arranged has been illustrated in the above-described embodiments, the same applies to a case where the p-type well structure is applied. For example, the photoelectric converter PD, the transfer transistor M1, and the floating diffusion FD that have the same configuration as those in the above-described embodiments can be arranged within a p-well (eighth semiconductor region) provided in an n-type semiconductor substrate.

Further, the imaging systems illustrated in the fifth and sixth embodiments are illustrated as an exemplary imaging system to which the imaging device of the present invention can be applied, and imaging systems to which the imaging device of the present invention can be applied are not limited to the configurations illustrated in FIG. 13 to FIG. 14B.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-014552, filed Jan. 30, 2017 which is hereby incorporated by reference herein in its entirety.

What is claimed is:

1. A solid-state imaging device comprising:
a plurality of pixels, each of the plurality of pixels including a photoelectric converter that generates charges by photoelectric conversion and a charge holding portion that holds charges transferred from the photoelectric converter,
wherein the photoelectric converter includes a first semiconductor region of a first conductivity type provided in a surface portion of a semiconductor substrate, a second semiconductor region of a second conductivity type provided under the first semiconductor region and configured to accumulate generated charges, a third semiconductor region of the first conductivity type provided under the second semiconductor region, and a fourth semiconductor region of the first conductivity type provided in a part of a portion between the first semiconductor region and the second semiconductor region,
wherein the second semiconductor region has a first region that does not overlap with the third semiconductor region in a plan view, and
wherein the fourth semiconductor region overlaps with at least a part of the first region in the plan view.

2. The solid-state imaging device according to claim 1, wherein the fourth semiconductor region overlaps with entirety of the first region in the plan view.

3. The solid-state imaging device according to claim 1 further comprising: a transfer transistor that transfers charges from the photoelectric converter to the charge holding portion,
wherein the fourth semiconductor region extends to a second region which is more spaced apart from a gate electrode of the transfer transistor than the first region is and in which the second semiconductor region overlaps with the third semiconductor region in the plan view.

4. The solid-state imaging device according to claim 1, wherein the fourth semiconductor region is provided inside the first region.

5. The solid-state imaging device according to claim 1, wherein the third semiconductor region has a third region and a fourth region that overlap with the second semiconductor region in the plan view, and the third region and the fourth region are spaced apart from each other.

6. The solid-state imaging device according to claim 5, wherein a gap between the third region and the fourth region is arranged so as to traverse the second semiconductor region in the plan view.

7. The solid-state imaging device according to claim 1, wherein the first region is arranged in a center portion of the second semiconductor region in the plan view.

8. The solid-state imaging device according to claim 1, wherein the photoelectric converter is provided in a sixth semiconductor region of the second conductivity type.

9. The solid-state imaging device according to claim 8,
wherein the semiconductor substrate has the second conductivity type, and
wherein the sixth semiconductor region is electrically isolated from another portion of the semiconductor substrate by a seventh semiconductor region of the first conductivity type.

10. The solid-state imaging device according to claim 1, wherein the photoelectric converter is provided in an eighth semiconductor region of the first conductivity type provided in the semiconductor substrate of the second conductivity type.

11. An imaging system comprising:
the solid-state imaging device according to claim 1; and
a signal processing unit that processes a signal output from the pixel of the solid-state imaging device.

12. A movable object comprising:
the solid-state imaging device according to claim 1;
a distance information acquisition unit adapted to acquire distance information of a distance to an object, from parallax images based on a signal from the imaging device; and
a control unit adapted to control the movable object based on the distance information.

13. A solid-state imaging device comprising:
a plurality of pixels, each of the plurality of pixels including a photoelectric converter that generates charges by photoelectric conversion and a charge holding portion that holds charges transferred from the photoelectric converter,
wherein the photoelectric converter includes a first semiconductor region of a first conductivity type provided in a surface portion of a semiconductor substrate, a second semiconductor region of a second conductivity type provided under the first semiconductor region and configured to accumulate generated charges, a third semiconductor region of the first conductivity type provided under the second semiconductor region, and a fifth semiconductor region of the second conductivity type provided in a depth between the first semiconductor region and the third semiconductor region,
wherein the second semiconductor region is provided in a first region that does not overlap with the third semiconductor region in a plan view and a second region that overlaps with the third semiconductor region in the plan view, and
wherein the fifth semiconductor region is provided in a same region as a region in which the third semiconductor region is provided in the plan view.

14. The solid-state imaging device according to claim 13, wherein the third semiconductor region has a third region and a fourth region that overlap with the second semiconductor region in the plan view, and the third region and the fourth region are spaced apart from each other.

15. The solid-state imaging device according to claim 14, wherein a gap between the third region and the fourth region is arranged so as to traverse the second semiconductor region in the plan view.

16. The solid-state imaging device according to claim 13, wherein the first region is arranged in a center portion of the second semiconductor region in the plan view.

17. The solid-state imaging device according to claim 13, wherein the photoelectric converter is provided in a sixth semiconductor region of the second conductivity type.

18. The solid-state imaging device according to claim 17,
wherein the semiconductor substrate has the second conductivity type, and
wherein the sixth semiconductor region is electrically isolated from another portion of the semiconductor substrate by a seventh semiconductor region of the first conductivity type.

19. The solid-state imaging device according to claim 13, wherein the photoelectric converter is provided in an eighth semiconductor region of the first conductivity type provided in the semiconductor substrate of the second conductivity type.

* * * * *